United States Patent
Muccini et al.

(10) Patent No.: US 9,710,051 B2
(45) Date of Patent: Jul. 18, 2017

(54) METHODS OF POWER SUPPLY UNIT ROTATING IN AN INFORMATION HANDLING SYSTEM

(71) Applicant: Dell Products, L.P., Round Rock, TX (US)

(72) Inventors: Mark A. Muccini, Georgetown, TX (US); Mehran Mirjafari, Austin, TX (US); William Draper, Austin, TX (US); Ashish Razdan, Round Rock, TX (US); Lei Wang, Austin, TX (US); John Evren Jenne, Austin, TX (US); Stuart Allen Berke, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 14/588,176

(22) Filed: Dec. 31, 2014

(65) Prior Publication Data

US 2017/0017293 A1    Jan. 19, 2017

(51) Int. Cl.
| | |
|---|---|
| *G06F 1/00* | (2006.01) |
| *G06F 1/32* | (2006.01) |
| *G06F 1/26* | (2006.01) |
| *G06F 1/30* | (2006.01) |
| *H05K 7/20* | (2006.01) |
| *G06F 1/18* | (2006.01) |

(52) U.S. Cl.
CPC ............ *G06F 1/3287* (2013.01); *G06F 1/263* (2013.01); *G06F 1/266* (2013.01); *G06F 1/30* (2013.01); *G06F 1/3225* (2013.01); *H05K 7/20709* (2013.01); *G06F 1/189* (2013.01); *Y02B 60/1285* (2013.01)

(58) Field of Classification Search
CPC ..... Y02B 60/1285; G06F 1/263; G06F 1/266; G06F 1/189
See application file for complete search history.

(56) References Cited

U.S. PATENT DOCUMENTS

| | | | | |
|---|---|---|---|---|
| 2010/0077238 A1* | 3/2010 | Vogman | .................. | G06F 1/263 713/310 |
| 2012/0144183 A1* | 6/2012 | Heinrichs | ........... | G06F 11/3062 713/100 |
| 2013/0335396 A1* | 12/2013 | Kim | ..................... | G09G 3/3208 345/212 |

* cited by examiner

*Primary Examiner* — Xuxing Chen
(74) *Attorney, Agent, or Firm* — Norton Rose Fulbright US LLP

(57) ABSTRACT

A method of power supply unit rotating in an information handling system (IHS) may include a control unit dividing a power loading of an IHS into N sections, where N corresponds to a number of power supply units coupled to the IHS. The control unit may configure a first power supply unit to an active state and configure one or more remaining power supply units to a suspended state during a first time period. The control unit may configure the first power supply unit to the suspended state and configure a second power supply unit to the active state in response to a second time period being reached. The control unit may rotate the active state among the power supply units in response to sequential time periods being reached. In an embodiment the control unit may rotate the active state sequentially between each of the subsequent power supplies.

20 Claims, 7 Drawing Sheets

METHODS OF POWER SUPPLY UNIT ROTATING IN AN INFORMATION HANDLING SYSTEM

FIELD

This disclosure relates generally to information handling systems, and more specifically, to methods of power supply unit rotating in an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems typically include multiple or redundant power supply units as a failsafe for power system malfunction. Power supply units may perform a variety of functions, such as, but not limited to, power conversion, alternating current to direct current (AC-DC) or DC-DC conversion, adjusting voltage levels, and/or providing backup power during power grid outages. Power supply states are typically referred to as "active" and "sleep". Active power supplies are those power supplies that are delivering power to an end system. A sleep state refers to a power supply state, for which the power supply is in a suspended state of operation. In a sleep state the supply is functional but not providing power to the end system. Generally active power supplies consume more power and thus run warmer compared to inactive power supplies. The lifespan of a power supply unit corresponds to watt-hours processed and relative environmental conditions. As a result, the more power an active power supply provides, the shorter the lifespan. Therefore the lifespan of an active power supply unit is shortened when compared to its sleeping counterpart. Conventional "hot or warm spare" solutions typically require half, or N/2 where N is the total number of power supply units in a system, of the power supply units to remain active at any given time in order to ensure availability during fault conditions. As a result, redundant power supply units of an information handling system may be placed in a "sleep" or "suspended" state for long periods of time, which can result in an imbalanced lifespan or expectancy of the power supply system as a whole. Furthermore, in some chassis systems where power supply units are connected via slots it is left to the user to perform a slot designation change (e.g., to a setting of either "active" or "sleep"). Consequently once a slot designation is changed by a user, the tendency is to leave the setting unchanged after the initial adjustment, thereby contributing to more life expectancy imbalance of the power supply system.

SUMMARY

In one embodiment a method of power supply unit rotating in an information handling system may include a control unit dividing a power loading of an information handling system into N sections, where N corresponds to a number of power supply units coupled to the information handling system. The control unit may configure a first power supply unit to an active state and configure one or more of the remaining power supply units to a suspended state during a first time period. The control unit may configure the first power supply unit to the suspended state and configure a second power supply unit to the active state in response to a second time period being reached. The control unit may rotate the active state among the power supply units in response to sequential time periods being reached. In an embodiment the control unit may rotate the active state sequentially between each of the subsequent power supply units.

In an embodiment the suspended state may include a sleep capable state. In another embodiment the suspended state may include a sleep state. In one embodiment the control unit may store a power load threshold value in firmware of each power supply unit. The control unit may dynamically adjust a duration of the time periods in response to a change in a power load profile of the information handling system. Similarly, the control unit may configure multiple power supply units to an active state simultaneously.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

Figure 1:
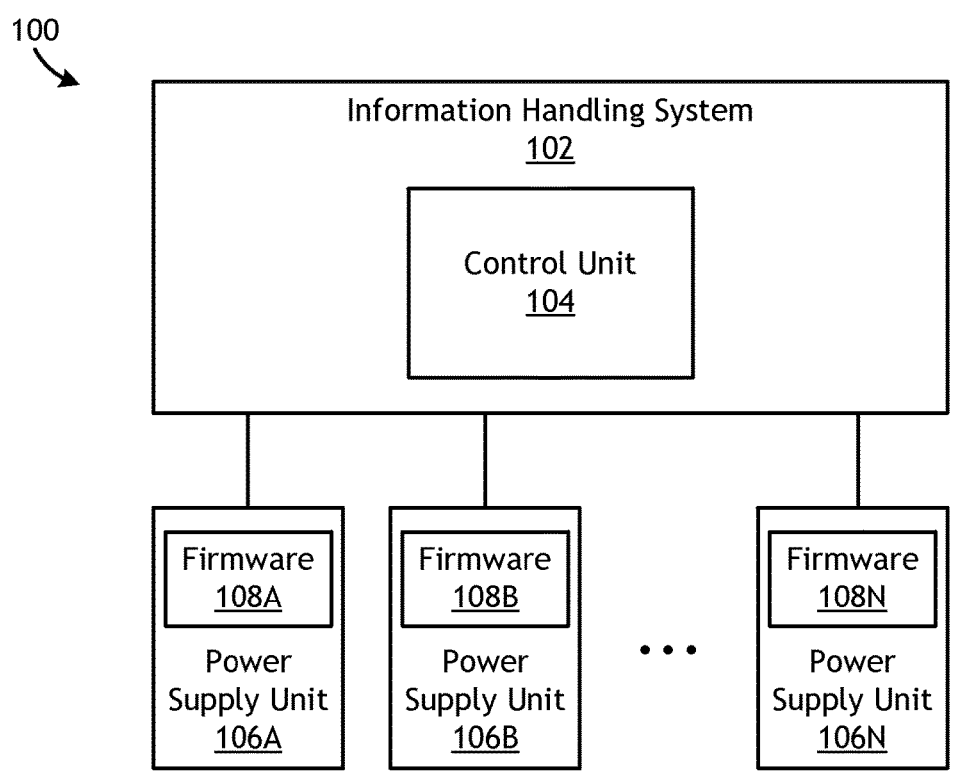
FIG. 1 is a schematic block diagram illustrating one embodiment of an information handling system with a multiple and/or redundant power supply configuration by which power supply unit rotating can be achieved.

Embodiments of methods and systems for power supply unit rotating in an information handling system are described. In an embodiment, a control unit dynamically rotates the active state with the sleep or suspended state among the power supply units based on power periods or energy delivered, thereby ensuring that each of the multiple power supply units are exposed to similar amounts of thermal and electrical stress over time.

In one embodiment, a control unit of an information handling system sets as many power supply units as possible to a suspended state during periods of light power load, and then rotates the active state sequentially via a "round robin" method among the power supply units based on a predefined time period. In one embodiment, a first power supply unit may be active while the others sleep during a first time period. At a second time period a second power supply unit may be active while the others sleep, and so forth. In an embodiment, the control unit may also activate additional power supply units during a time period in response to an increase in power demand, for example if the power loading increases above a threshold value then two or more power supplies may be active during each time period of the rotation. Conversely, if power system demand drops then the control unit may perform "unit shedding" by reducing the number of power supply units that are simultaneously active during each time period of the rotation. The present system is thus not limited to N/2 active units like conventional hot spare systems, where N is defined as the number of power supplies.

For example, if the system load is between a fractional load of (N−1)/N to full load, then all N power supplies would need to be running. If the system load is between a fractional load of (N−2)/N to a fractional load of (N−1)/N then N−1 power supplies would need to be running. Similarly, if the system is between a fractional load of (N−3)/N to a fractional load of (N−2)/N then N−2 power supplies would need to be running, and so forth. If the system load is between zero to 1/N load, then only 1 power supply needs to be running. Regardless of the system load section, the system should rotate all "active" power supplies. For example, if the system load is greater than a fraction of 1/N of the full load and less than 2/N of the full load then there will be 2 active power supplies. Those 2 active power supplies would then be rotated between the N power supplies during sequential time periods, where the length of the time periods may be adjusted depending on load analysis.

The present invention thus provides a wear leveling effect across the power supply system as a whole by minimizing the number of active power supplies dynamically based on power system loading and by rotating the sleep state through all of the power supplies over time. Dynamically adjusting the number of active power supplies based on system loading improves the power efficiency of the system as a whole. Similarly, rotating the active state among the power supply units helps even out the cumulative thermal and electrical stress factors across the multiple power supply units of the system, thereby increasing the average life of the power supply units. Balancing the power consumption and temperature stress may thus improve the reliability of the power supply system by extending the mean time between failure of the power supply units.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

FIG. 1 is a schematic circuit diagram illustrating one embodiment of an information handling system with a multiple and/or redundant power supply configuration by which power supply unit rotating can be achieved. In one embodiment a system 100 for adjusting power supply modes may include an information handling system (IHS) 102. IHS 102 may include a control unit 104. In an embodiment control unit 104 may be a processor, microcontroller, firmware, software program, or the like. System 100 may also include multiple power supply units 106A-N communicatively connected to IHS 102. In one embodiment control unit 104 may set one or more of power supply units 106A-N to an active state. Similarly, control unit 104 may set one or more of power supply units 106A-N to a suspended state, which may correspond to a sleep state or a sleep-capable state.

In one embodiment power supply units 106A-N may include firmware, such as firmware 108A-N. In another embodiment IHS 102 may include firmware 110. In an embodiment, control unit 104 may store a power load threshold value in firmware 108A-N. The power load threshold value may correspond to an aggregate power level of one or more components of IHS 102, for example the aggregate of central processing unit (CPU) power, memory power, hard disk drive power, and peripheral component interface power. In one embodiment, control unit 104 may set the power load threshold value based on a minimum number of power supply units 106A-N that are required to be active in order to meet the aggregate power demand of the components of IHS 102. In one embodiment each of power supply units 106A-N may monitor the power load of IHS 102 via an intelligent power management module (IPMM), load share line, or the like. In an embodiment, during a fault condition a single active power supply unit may dictate all of the sleeping power supply units to wake up.

Figure 2:
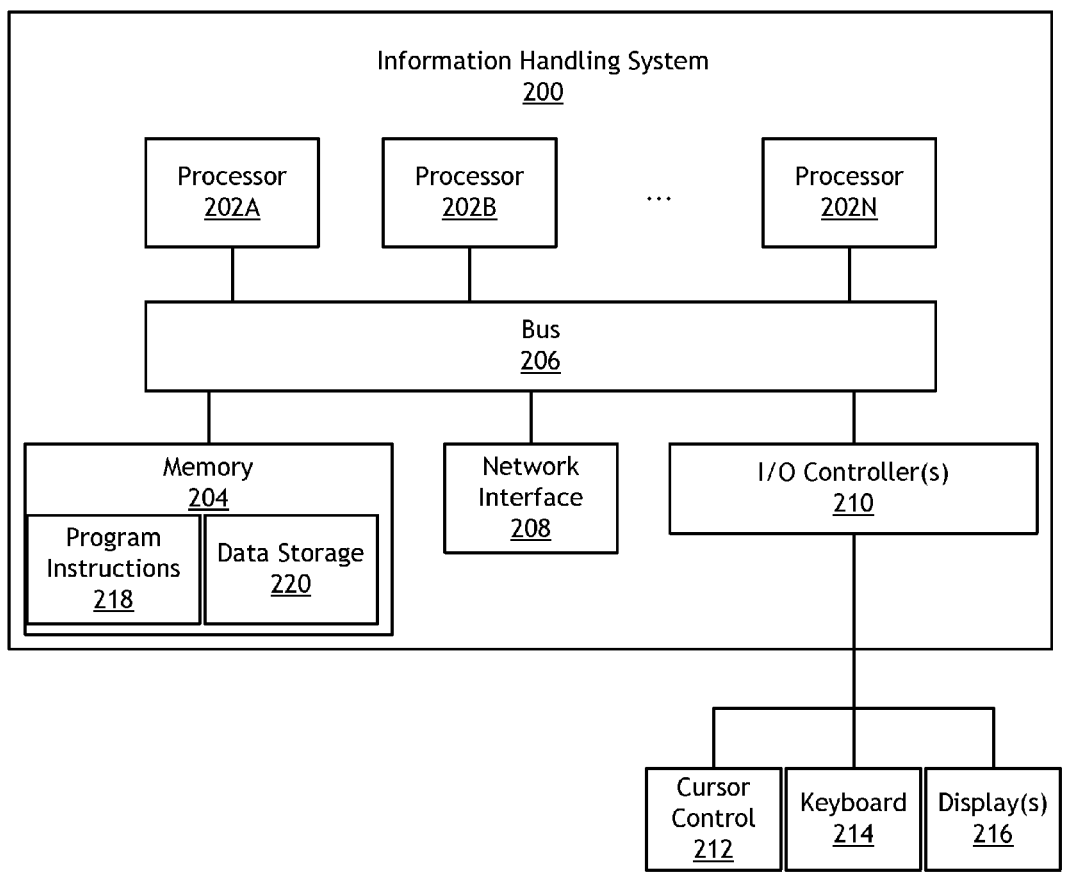
FIG. 2 is a schematic block diagram illustrating one embodiment of an Information Handling System (IHS) configured for power supply unit rotating.

FIG. 2 is a schematic block diagram illustrating one embodiment of an IHS 200 configurable for power supply unit rotating. In one embodiment, IHS 102 may be implemented on an information handling system similar to IHS 200 described in FIG. 2. Similarly, control unit 104 may be implemented on an information handling system similar to IHS 200 described in FIG. 2. System 100 may also be implemented on an information handling system similar to the IHS 200. In various embodiments, IHS 200 may be a server, a mainframe computer system, a workstation, a network computer, a desktop computer, a laptop, or the like.

As illustrated, IHS 200 includes one or more processors 202A-N coupled to a system memory 204 via bus 206. IHS 200 further includes network interface 208 coupled to bus 206, and input/output (I/O) controller(s) 210, coupled to devices such as cursor control device 212, keyboard 214, and display(s) 216. In some embodiments, a given entity (e.g., IHS 102) may be implemented using a single instance of IHS 200, while in other embodiments multiple such information handling systems, or multiple nodes making up IHS 200, may be configured to host different portions or instances of embodiments (e.g., control unit 104). In one embodiment IHS 200 may include a redundant power supply system 222 coupled to bus 206. Redundant power supply system 222 may perform functions of embodiments illustrated in FIG. 1, FIG. 3, FIG. 4, FIG. 5, FIG. 6, and/or FIG. 7.

In various embodiments, IHS 200 may be a single-processor information handling system including one processor 202A, or a multi-processor information handling system including two or more processors 202A-N (e.g., two, four, eight, or another suitable number). Processor(s) 202A-N may be any processor capable of executing program instructions. For example, in various embodiments, processor(s) 202A-N may be general-purpose or embedded processors implementing any of a variety of instruction set architectures (ISAs), such as the x86, POWERPC®, ARM®, SPARC®, or MIPS® ISAs, or any other suitable ISA. In multi-processor systems, each of processor(s) 202A-N may commonly, but not necessarily, implement the same ISA. Also, in some embodiments, at least one processor(s) 202A-N may be a graphics processing unit (GPU) or other dedicated graphics-rendering device.

System memory 204 may be configured to store program instructions and/or data accessible by processor(s) 202A-N. For example, memory 204 may be used to store a software program and/or database shown in FIG. 3 and FIG. 4. In various embodiments, system memory 204 may be implemented using any suitable memory technology, such as static random access memory (SRAM), synchronous dynamic RAM (SDRAM), nonvolatile/Flash-type memory, or any other type of memory. As illustrated, program instructions and data implementing certain operations, such as, for example, those described above, may be stored within system memory 204 as program instructions 218 and data storage 220, respectively. In other embodiments, program instructions and/or data may be received, sent or stored upon different types of IHS-accessible media or on similar media separate from system memory 204 or IHS 200. Generally speaking, a IHS-accessible medium may include any tangible, non-transitory storage media or memory media such as electronic, magnetic, or optical media—e.g., disk or CD/DVD-ROM coupled to IHS 200 via bus 206, or non-volatile memory storage (e.g., "flash" memory)

The terms "tangible" and "non-transitory," as used herein, are intended to describe an IHS-readable storage medium (or "memory") excluding propagating electromagnetic signals, but are not intended to otherwise limit the type of physical IHS-readable storage device that is encompassed by the phrase IHS-readable medium or memory. For instance, the terms "non-transitory IHS readable medium" or "tangible memory" are intended to encompass types of storage devices that do not necessarily store information permanently, including for example, random access memory (RAM). Program instructions and data stored on a tangible IHS-accessible storage medium in non-transitory form may further be transmitted by transmission media or signals such as electrical, electromagnetic, or digital signals, which may be conveyed via a communication medium such as a network and/or a wireless link.

In an embodiment, bus 206 may be configured to coordinate I/O traffic between processor 202, system memory 204, and any peripheral devices including network interface 208 or other peripheral interfaces, connected via I/O controller(s) 210. In some embodiments, bus 206 may perform any necessary protocol, timing or other data transformations to convert data signals from one component (e.g., system memory 204) into a format suitable for use by another component (e.g., processor(s) 202A-N). In some embodiments, bus 206 may include support for devices attached through various types of peripheral buses, such as a variant of the Peripheral Component Interconnect (PCI) bus standard or the Universal Serial Bus (USB) standard, for example. In some embodiments, the operations of bus 206 may be split into two or more separate components, such as a north bridge and a south bridge, for example. In addition, in some embodiments some or all of the operations of bus 206, such as an interface to system memory 204, may be incorporated directly into processor(s) 202A-N.

Network interface 208 may be configured to allow data to be exchanged between IHS 200 and other devices, such as other information handling systems attached to power supply units 106A-N, for example. In various embodiments, network interface 208 may support communication via wired or wireless general data networks, such as any suitable type of Ethernet network, for example; via telecommunications/telephony networks such as analog voice networks or digital fiber communications networks; via storage area networks such as Fiber Channel SANs, or via any other suitable type of network and/or protocol.

I/O controller(s) 210 may, in some embodiments, enable connection to one or more display terminals, keyboards, keypads, touch screens, scanning devices, voice or optical recognition devices, or any other devices suitable for entering or retrieving data by one or more IHS 200. Multiple input/output devices may be present in IHS 200 or may be distributed on various nodes of IHS 200. In some embodiments, similar I/O devices may be separate from IHS 200 and may interact with IHS 200 through a wired or wireless connection, such as over network interface 208.

As shown in FIG. 2, memory 204 may include program instructions 218, configured to implement certain embodiments described herein, and data storage 220, comprising various data accessible by program instructions 218. In an embodiment, program instructions 218 may include software elements of embodiments illustrated in FIG. 3, FIG. 4, FIG. 5, FIG. 6, and/or FIG. 7. For example, program instructions 218 may be implemented in various embodiments using any desired programming language, scripting language, or combination of programming languages and/or scripting languages. Data storage 220 may include data that may be used in these embodiments such as, for example, firmware 108A-N. In other embodiments, other or different software elements and data may be included.

A person of ordinary skill in the art will appreciate that IHS 200 is merely illustrative and is not intended to limit the scope of the disclosure described herein. In particular, the information handling system and devices may include any combination of hardware or software that can perform the indicated operations. In addition, the operations performed by the illustrated components may, in some embodiments, be performed by fewer components or distributed across additional components. Similarly, in other embodiments, the operations of some of the illustrated components may not be performed and/or other additional operations may be available. Accordingly, systems and methods described herein may be implemented or executed with other information handling system configurations.

Embodiments of system 100 described in FIG. 1, FIG. 3, FIG. 4, FIG. 5, FIG. 6, and FIG. 7 may be implemented in an information handling system that is similar to IHS 200. In one embodiment, the elements described in FIG. 1, FIG. 3, FIG. 4, FIG. 5, FIG. 6, and/or FIG. 7 may be implemented in discrete hardware modules. Alternatively, the elements may be implemented in software-defined modules which are executable by one or more of processors 202A-N, for example.

Figure 3:
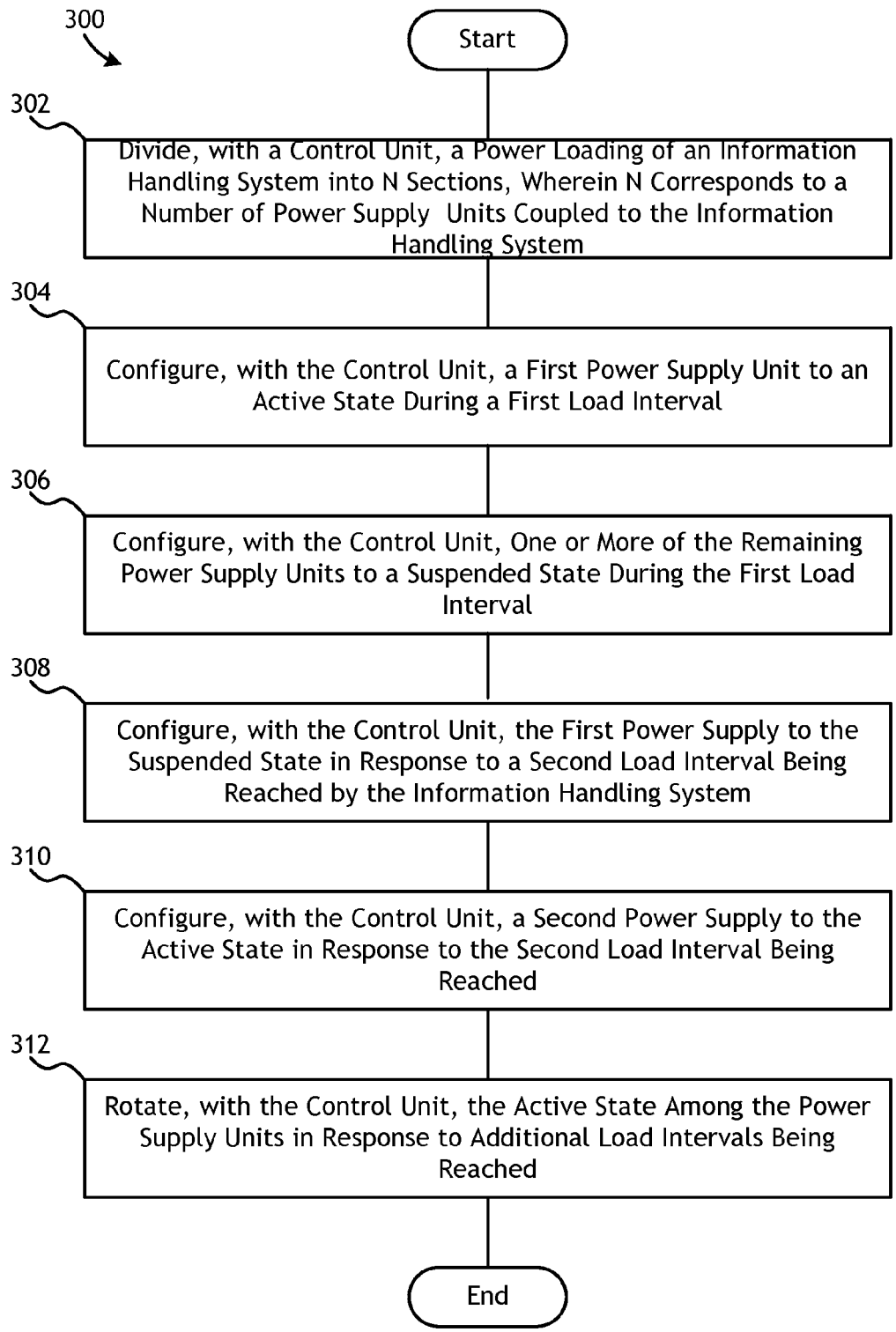
FIG. 3 is a schematic flowchart diagram illustrating one embodiment of a method for power supply unit rotating in an information handling system.

FIG. 3 is a schematic flowchart diagram illustrating one embodiment of a method 300 for power supply unit rotating in an information handling system. At block 302, the method 300 includes dividing, with a control unit 104, a power loading of an information handling system 102 into N sections, wherein N corresponds to a number of power supply units 106A-N coupled to the information handling system 102. At block 304, the method includes configuring, with the control unit 104, a first power supply unit 106A to an active state during a first time period. At block 306, the method includes configuring, with the control unit 104, one or more of the remaining power supply units 106B-N to a suspended state during the first time period. In one embodiment the suspended state may be a sleep state. In another embodiment the suspended state may be a sleep-capable state.

As depicted in block 308, the method includes configuring, with the control unit 104, the first power supply unit 106A to the suspended state in response to a second time period being reached. As shown in block 310, the method includes configuring, with the control unit 104, a second power supply 106B to the active state in response to the second time period being reached. In one embodiment the method may include configuring, with the control unit 104, multiple power supply units to an active state simultaneously. As depicted in block 312, the method includes rotating, with the control unit 104, the active state among the power supply units 106A-N in response to sequential time periods being reached. In one embodiment control unit 104 may rotate the active state sequentially among the power supply units 106A-N. In another embodiment the method may include dynamically adjusting, with the control unit 104, a duration of the time periods in response to a change in a power load profile of the information handling system 102. In yet another embodiment the method may include storing, via the control unit 104, a power load threshold value in firmware 108A-N of each power supply unit 106A-N.

Figure 4:
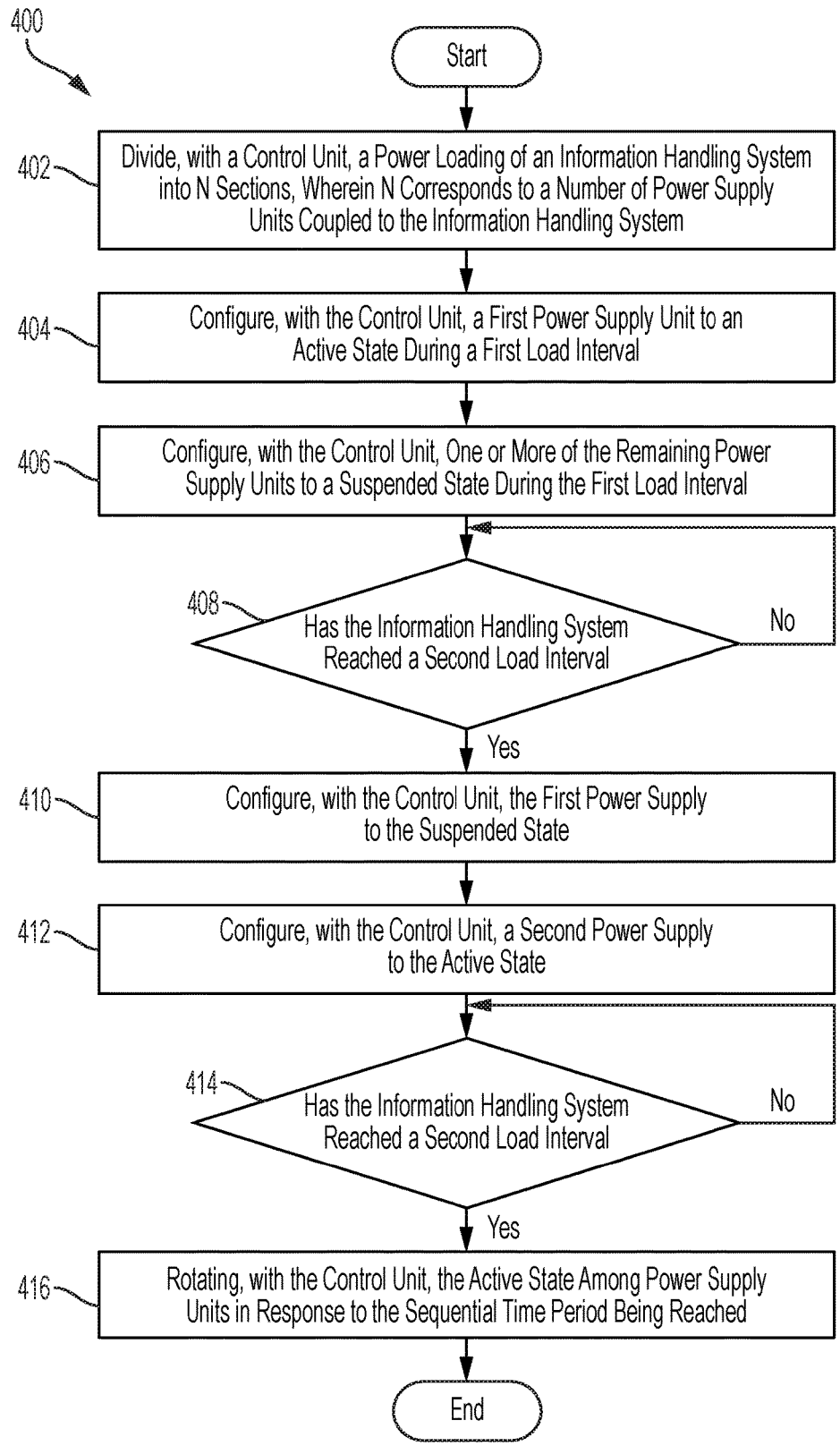
FIG. 4 is a schematic flowchart diagram illustrating an embodiment of a method for power supply unit rotating in an information handling system.

FIG. 4 is a schematic flowchart diagram illustrating one embodiment of a method 400 for power supply unit rotating in an information handling system. As shown in block 402 the control unit 104 divides a power loading of an information handling system 102 into N sections, wherein N corresponds to a number of power supply units 106A-N coupled to the information handling system 102. As depicted in block 404 the control unit 104 configures a first power supply unit 106A to an active state during a first time period. At block 406 the control unit 104 configures one or more of the remaining power supply units 106B-N to a suspended state during the first time period. In one embodiment the suspended state may be a sleep state. In another embodiment the suspended state may be a sleep-capable state.

As depicted in block 408 the control unit 104 monitors whether IHS 102 has reached a second load interval. When IHS 102 reaches the second load interval, the control unit 104 configures the first power supply unit 106A to the suspended state, as shown in block 410. As depicted in block 412 the control unit 104 configures a second power supply 106B to the active state. In one embodiment the method may include configuring, with the control unit 104, multiple power supply units to an active state simultaneously based on the aggregate power loading of IHS 102. At block 414 the control unit 104 determines whether additional load intervals have been reached by HIS 102. When an additional load interval is reached by IHS 102, the control unit 104 divides a power loading of an information handling system into N sections, wherein N corresponds to a number of power supply units coupled to the information handling system. In one embodiment control unit 104 may rotate the active state sequentially among the power supply units 106A-N. In another embodiment the control unit 104 may dynamically adjust a duration of the time periods in response to a change in a power load profile of the information handling system 102. In yet another embodiment the control unit 104 may store a power load threshold value in firmware 108A-N of each power supply unit 106A-N. Similarly, the control unit 104 may compare the power load threshold value to the aggregate power loading of IHS 102 in order to dynamically adjust the active state of one or more of power supply units 106A-N.

Figure 5:
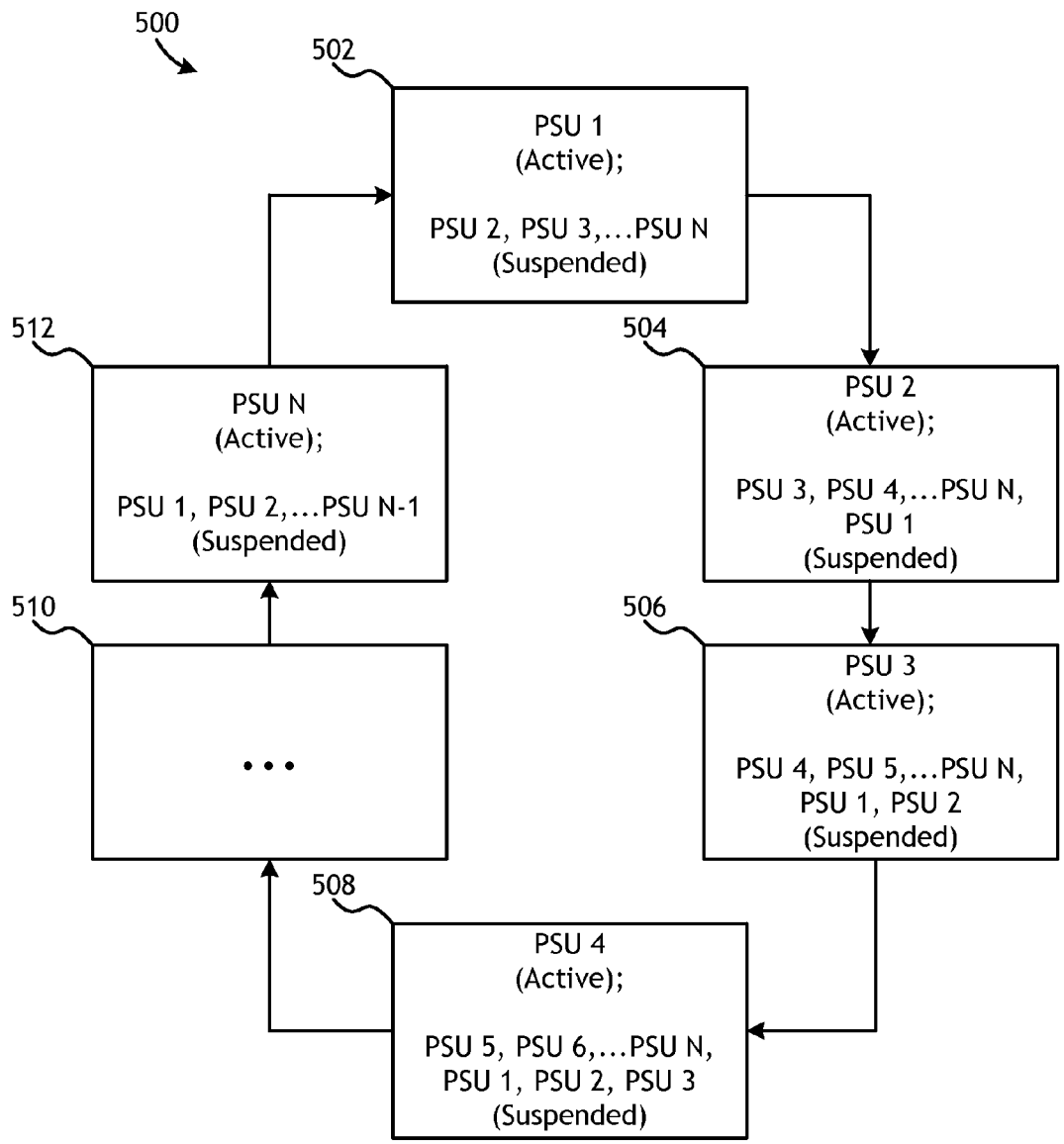
FIG. 5 is a schematic state machine diagram illustrating one embodiment of a method for power supply unit rotating in an information handling system.

FIG. 5 is a schematic state machine diagram illustrating one embodiment of a method for power supply unit rotating in an information handling system. In one embodiment rotating state machine 500 may include a first state 502 in which a first power supply unit is active while all of the other power supply units are in a suspended state, such as a sleep state or a sleep capable state. All the states here thus correspond to a relatively low aggregate power load profile of IHS 102 in that only a single active power supply unit is required during the first time period. During a second time period, a second power supply unit is active and all of the other power supply units are in a suspended state, as shown in state 504. As depicted in state 506, a third power supply unit is active during the third time period while all of the other power supply units are in a suspended state. As shown in the fourth state 508, which corresponds to a fourth time period, a fourth power supply unit is active and the remaining power supply units are suspended. The process continues, as shown in block 510, until the Nth time period is reached. During the Nth time period only the Nth power supply is active, as shown in state 512. The rotation process then repeats as needed. In one embodiment the logic of rotating state machine 500 may be controlled by control unit 104. In another embodiment the logic of rotating state machine 500 may be controlled by firmware 108A-N, thereby enabling each of power supply units 106A-N to monitor and react to the power load of IHS 102 via an intelligent power management module (IPMM), load share line, or the like.

Figure 6:
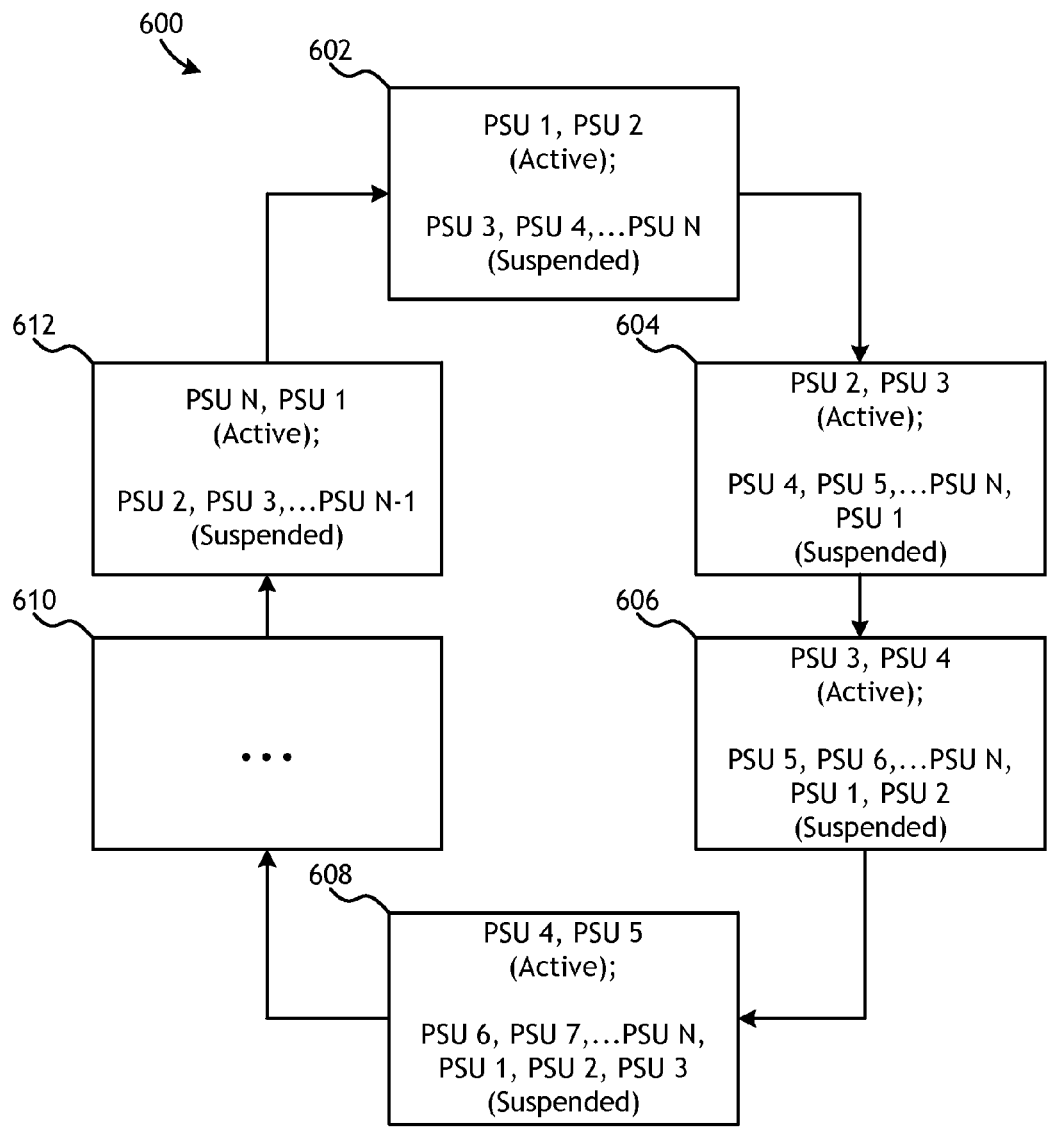
FIG. 6 is a schematic state machine diagram illustrating another embodiment of a method for power supply unit rotating in an information handling system.

FIG. 6 is a schematic state machine diagram illustrating another embodiment of a method for power supply unit rotating in an information handling system. In one embodiment rotating state machine 600 may include a first state 602 in which both a first power supply unit and a second power supply unit are active while all of the remaining power supply units are in a suspended state, such as a sleep state or a sleep capable state. All the states here thus correspond to a higher aggregate power load profile of IHS 102 than state 502 from FIG. 5, since for state 602 two active power supply units are required during the first time period. During a second time period, both the second power supply unit and a third power supply unit are active and all of the other power supply units are in a suspended state, as shown in state 604. As depicted in state 606, a third power supply unit and a fourth power supply unit are active during the third time period while all of the other power supply units are in a suspended state. As shown in the fourth state 608, which corresponds to a fourth time period, both the fourth and fifth power supply units are active and the remaining power supply units are suspended. The process continues, as shown in block 610, until the Nth time period is reached. During the Nth time period both the Nth power supply and the first power supply are active, as shown in state 612. The rotation process then repeats as needed.

In other embodiments system 100 may be implemented via state machines that employ up to N active power supply units dynamically during each time period, for example during periods of high system power demand. In one embodiment the logic of rotating state machine 500 may be controlled by control unit 104. In another embodiment the logic of rotating state machine 500 may be controlled by firmware 108A-N, thereby enabling each of power supply units 106A-N to monitor and react to the power load of IHS 102 via an intelligent power management module (IPMM), load share line, or the like.

Figure 7:
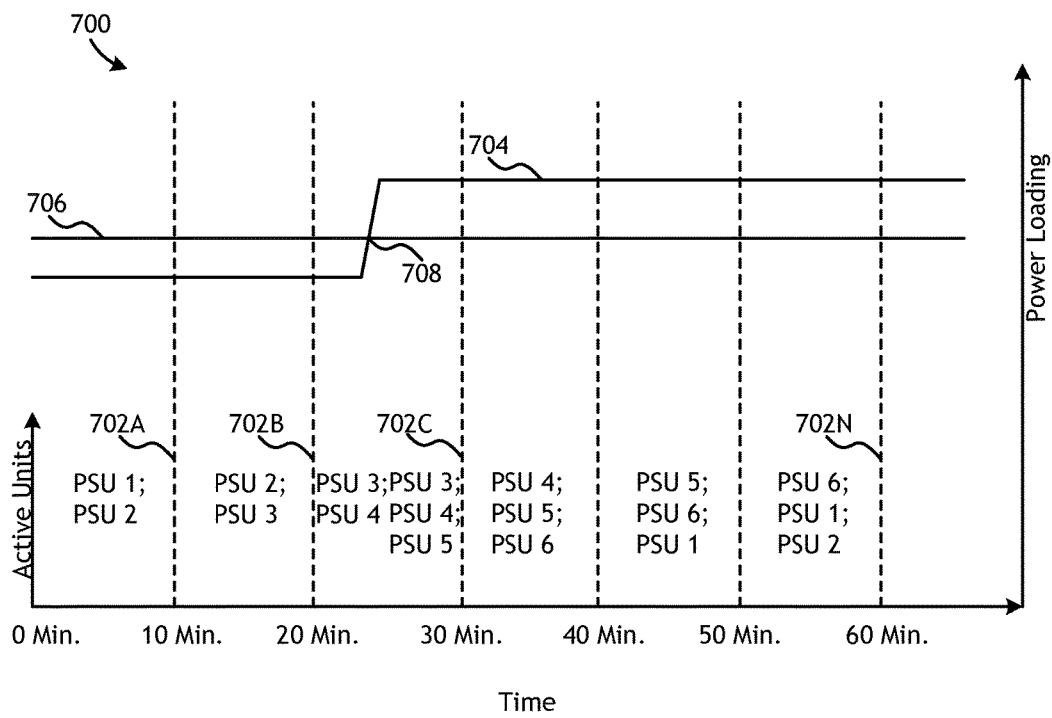
FIG. 7 is a schematic power loading graph illustrating one embodiment of a method for power supply unit rotating in an information handling system.

FIG. 7 is a schematic power loading graph illustrating one embodiment of a method for power supply unit rotating in an information handling system. As depicted, power loading graph 700 includes multiple time periods 702A-N. In one embodiment time periods 702A-N may be set to an initial uniform default value, for example 10 minutes each. In another embodiment control unit 104 may dynamically adjust the duration of the time periods 702A-N in response to the power load profile of IHS 102.

As shown, power loading graph 700 includes a power loading curve 704 and a power load threshold value 706. In an embodiment power loading curve 704 corresponds to the aggregate power load of IHS 102 during the time periods 702A-N. Power loading graph 700 also includes a power load threshold crossover point 708 where power loading curve 704 equals power load threshold value 706. The power load threshold crossover point 708 may thus occur when power loading curve 704 either rises above or falls below power load threshold value 706. For example, if there are N power supplies in the system, then there will be N−1 load thresholds.

In an embodiment, control unit 104 may configure one or more additional power supply units to an active state during time periods 702A-N in which a power load threshold crossover point 708 occurs. For example, as shown in power loading graph 700, the power demand of IHS 102 increased prior to the end of the third time period 702C. Consequently control unit 104 configured an additional power supply unit to an active state, thereby increasing the number of active power supply units from two active power supply units prior the power load threshold crossover point 708 to three active power supply units after the power load threshold crossover point 708. Similarly, if a drop in the power demand of IHS 102 results in a different power load threshold crossover point where power loading curve 704 drops below power load threshold value 706, then control unit 104 may decrease the number of active power supply units via unit shedding during the time period where the power load threshold crossover point occurs. In another embodiment the number of active power supply units may be controlled by firmware 108A-N. The present invention thus provides a method of dynamically adjusting power supply modes for the purposes of power supply unit wear leveling and energy conservation, thereby contributing to the increased efficiency, reliability, and longevity of the power supply system as a whole.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A method of adjusting power supply modes, comprising:
    dividing, with a control unit, a power loading of an information handling system into N sections, wherein N corresponds to a number of power supply units coupled to the information handling system;
    configuring, with the control unit, a first power supply unit to an active state during a first time period;
    configuring, with the control unit, one or more of the remaining power supply units to a suspended state during the first time period;
    configuring, with the control unit, the first power supply to the suspended state in response to a second time period being reached;
    configuring, with the control unit, a second power supply to the active state in response to the second time period being reached;
    rotating, with the control unit, the active state among the power supply units in response to sequential time periods being reached; and
    dynamically adjusting, with the control unit, a duration of time periods in response to a change in a power load profile of the information handling system.

2. The method of claim 1, wherein the suspended state comprises a sleep capable state.

3. The method of claim 1, wherein the suspended state comprises a sleep state.

4. The method of claim 1, further comprising rotating, with the control unit, the active state sequentially between each of the subsequent power supply units.

5. The method of claim 1, further comprising storing, via the control unit, a power load threshold value in firmware of each power supply unit.

6. The method of claim 5, further comprising monitoring, by the first power supply unit, the power loading of the information handling system; and comparing, by the first power supply unit, the power loading with the power load threshold value in firmware.

7. The method of claim 1, further comprising configuring, with the control unit, a plurality of the power supply units to an active state simultaneously.

8. A system for adjusting power supply modes, comprising:
   an information handling system;
   a plurality of power supply units coupled to the information handling system; and
   a control unit of the information handling system, wherein the control unit:
     divides a power loading of the information handling system into N sections, wherein N corresponds to a number of the power supply units;
     configures a first power supply unit to an active state during a first time period;
     configures one or more of the remaining power supply units to a suspended state during the first time period;
     configures the first power supply to the suspended state in response to a second time period being reached;
     configures a second power supply to the active state in response to the second time period being reached;
     rotates the active state among the power supply units in response to sequential time periods being reached; and
     dynamically adjusts a duration of time periods in response to a change in a power load profile of the information handling system.

9. The system of claim 8, wherein the information handling system comprises a server system.

10. The system of claim 8, wherein the information handling system comprises a storage system.

11. The system of claim 8, wherein the information handling system comprises a networking system.

12. The system of claim 8, wherein the control unit rotates the active state sequentially between each of the subsequent power supply units.

13. The system of claim 8, wherein the control unit stores a power load threshold value in firmware of each power supply unit.

14. The system of claim 13, wherein the first power supply unit: monitors the power loading of the information handling system; and compares the power loading with the power load threshold value in firmware.

15. The system of claim 8, wherein the control unit configures a plurality of the power supply units to an active state simultaneously.

16. An apparatus for adjusting power supply modes, comprising:
   an information handling system;
   a plurality of power supply units coupled to the information handling system; and
   a control unit of the information handling system, wherein the control unit:
     divides a power loading of the information handling system into N sections, wherein N corresponds to a number of the power supply units;
     configures a first power supply unit to an active state during a first time period;
     configures one or more of the remaining power supply units to a suspended state during the first time period;
     configures the first power supply to the suspended state in response to a second time period being reached;
     configures a second power supply to the active state in response to the second time period being reached;
     rotates the active state among the power supply units m response to sequential time periods being reached; and
     stores a power load threshold value in firmware of each power supply unit.

17. The apparatus of claim 16, wherein the control unit rotates the active state sequentially between each of the subsequent power supply units.

18. The apparatus of claim 16, wherein the first power supply unit: monitors the power loading of the information handling system; and compares the power loading with the power load threshold value in firmware.

19. The apparatus of claim 16, wherein the control unit dynamically adjusts a duration of time periods in response to a change in a power load profile of the information handling system.

20. The apparatus of claim 16, wherein the control unit configures a plurality of the power supply units to an active state simultaneously.

* * * * *